United States Patent
Miyawaki

(10) Patent No.: US 6,621,161 B2
(45) Date of Patent: Sep. 16, 2003

(54) SEMICONDUCTOR DEVICE HAVING A PACKAGE STRUCTURE

(75) Inventor: Katumi Miyawaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/764,135

(22) Filed: Jan. 19, 2001

(65) Prior Publication Data

US 2001/0001740 A1 May 24, 2001

Related U.S. Application Data

(62) Division of application No. 09/408,844, filed on Sep. 30, 1999, now Pat. No. 6,268,236.

(51) Int. Cl.[7] .................. H01L 23/34; H01L 23/053; H01L 23/12
(52) U.S. Cl. .................. 257/723; 257/701; 257/704; 257/728; 257/620; 257/622; 257/784; 257/787; 438/430; 438/462
(58) Field of Search .................. 257/701, 704, 257/723, 728, 620, 622, 434, 703, 784, 787, 690; 438/430, 462, 458, 460

(56) References Cited

U.S. PATENT DOCUMENTS

| 5,041,396 A | | 8/1991 | Valero |
| 5,467,253 A | | 11/1995 | Heckman et al. |
| 5,821,161 A | * | 10/1998 | Covell, II et al. .......... 438/613 |
| 5,923,958 A | | 7/1999 | Chou |
| 5,949,655 A | * | 9/1999 | Glenn .................. 361/783 |
| 5,950,070 A | | 9/1999 | Razon et al. |

FOREIGN PATENT DOCUMENTS

| DE | 19620940 | | 5/1997 | |
| JP | 1-134956 | | 5/1989 | |
| JP | 401134956 | * | 5/1989 | .................. 23/8 |
| JP | 4-148553 | | 5/1992 | |
| JP | 04-148553 | | 5/1992 | |
| JP | 4041485553 | * | 5/1992 | .................. 23/12 |
| JP | 4-148553 | | 5/1998 | |

* cited by examiner

*Primary Examiner*—Tom Thomas
*Assistant Examiner*—Nitin Parekh
(74) *Attorney, Agent, or Firm*—McDermott, Will & Emery

(57) ABSTRACT

A semiconductor device comprises a first plate-like base substrate having a substantially rectangular extrapolated outer shape in a plane parallel to the primary surface thereof, and the first plate-like base substrate has a base electrode on the rear surface thereof. A second plate-like base substrate is connected to the primary surface of the first plate-like base substrate, and the second plate-like base substrate has a substantially same extrapolated outer shape in a plane parallel to the primary surface of the first plate-like base substrate. The second plate-like base substrate has a penetrating hole perpendicular to the primary surface of the first plate-like base substrate. A plate-like cap member is connected to the second plate-like base substrate to cover the penetrating hole in the second plate-like base substrate. A semiconductor chip is housed in a cavity surrounded by the first plate-like base substrate, the second plate-like base substrate and the plate-like cap member, and the semiconductor chip is electrically connected to the base electrode. Further, the first and second plate-like base substrates are cut off at each ridge portion of the side surfaces thereof which correspond to a corner portion of the substantially rectangular extrapolated outer shape.

6 Claims, 6 Drawing Sheets

SEMICONDUCTOR DEVICE HAVING A PACKAGE STRUCTURE

This application is a Divisional of application Ser. No. 09/408,844 filed Sep. 30, 1999 U.S. Pat. No. 6,268,236.

BACKGROUND OF THE INVENTION

1. Field of the Invention

The present invention relates to a semiconductor device, and more particularly, relates to a structure of a package of a high-frequency semiconductor element such as a GaAs-FET.

2. Background Art

In a semiconductor package utilized in a high-frequency band, more particularly the C-band or the Ku-band, a substance such as epoxy resin having a large dielectric constant comes into close contact with a semiconductor chip within a commonly-used mold package, thereby introducing parasitic capacitance and deteriorating the characteristics of the semiconductor package. To prevent such parasitic capacitance, a package having a hollow cavity is commonly used for encapsulating the semiconductor chip so that the air surrounds the top surface of the semiconductor chip.

In contrast with the commonly-used transfer mold package, the hollow package involves the following disadvantages and hence suffers negative aspects in terms of productivity and costs.

First, when packages are transported as separate pieces, the packages must be frequently rearranged in different layouts during assembly/test processes.

Further, when a carrier belt is used for transporting the packages, the packages may be brought into random arrangements upon undergoing very small physical shock. Further, in the case where the carrier belt is used for transporting the packages, there is a limitation on the number of packages processed by an automatic machine, thus deteriorating productivity of the semiconductor package.

Second, as is likely to be the case with a lead frame, separate packages are brazed to a metal frame through use of a brazing filler material of Ag in order to improve productivity, so that the packages are brazed so as to assume the structure of a commonly-used mold-type lead frame. In this case, however, brazing adds to the manufacturing costs. Further, even in terms of productivity, the separate packages must be individually sealed in the course of a sealing process. Thus, the hollow package is inferior in productivity to the mold package.

The present invention has been conceived to solve the problem in the background art, and the object of the present invention is to provide a semiconductor device encapsulated in a hollow package, which prevents deterioration of the high-frequency characteristics of the semiconductor device while ensuring the same productivity and costs as achieved by the mold package.

SUMMARY OF THE INVENTION

According to one aspect of the present invention, a semiconductor device is provided which is manufactured according to a following method. In the method, a semiconductor chip is housed in each of a plurality of cavities formed in the primary surface of a plate-like base substrate. A plate-like cap member is bonded onto the primary surface of the base substrate. Further, the bonded base substrate and cap members are separated along each space between adjacent cavities to thereby form a plurality of semiconductor devices which includes the semiconductor chip respectively.

According to another aspect of the invention, a semiconductor device comprises a first plate-like base substrate having a substantially rectangular extrapolated outer shape in a plane parallel to the primary surface thereof, and the first plate-like base substrate has a base electrode on the rear surface thereof. A second plate-like base substrate is connected to the primary surface of the first plate-like base substrate, and the second plate-like base substrate has a substantially same extrapolated outer shape in a plane parallel to the primary surface of the first plate-like base substrate. The second plate-like base substrate has a penetrating hole perpendicular to the primary surface of the first plate-like base substrate. A plate-like cap member is connected to the second plate-like base substrate to cover the penetrating hole in the second plate-like base substrate. A semiconductor chip is housed in a cavity surrounded by the first plate-like base substrate, the second plate-like base substrate and the plate-like cap member, and the semiconductor chip is electrically connected to the base electrode. Further, the first and second plate-like base substrates are cut off at each ridge portion of the side surfaces thereof which correspond to a corner portion of the substantially rectangular extrapolated outer shape.

Other and further objects, features and advantages of the invention will appear more fully from the following description.

DETAILED DESCRIPTION OF THE PREFERRED EMBODIMENTS

Figure 1:
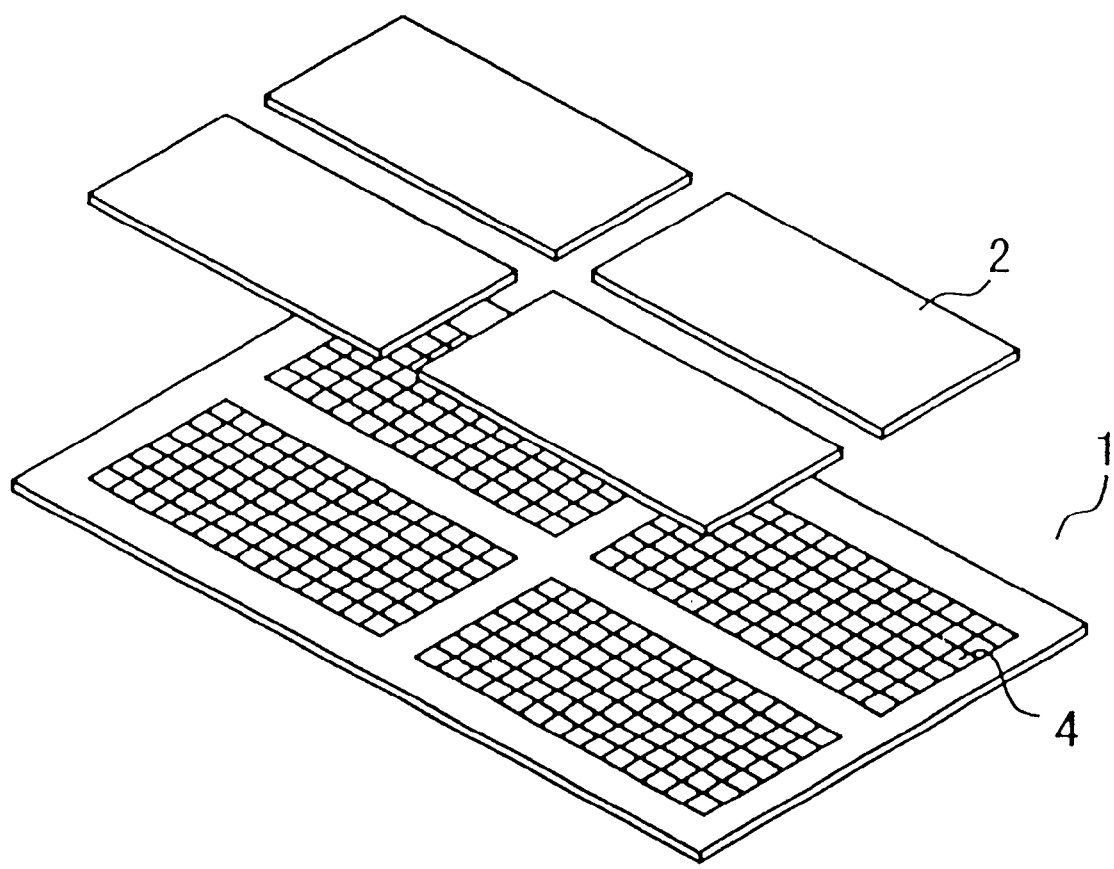
FIG. 1 is a perspective view showing a base package substrate and cap members before they are bonded together.

Preferred embodiments of the present invention will be described hereinbelow by reference to the accompanying drawings. Through the drawings, like reference numerals are assigned to like or corresponding elements, and repeated explanations are simplified or omitted.

First Embodiment

Figure 2A:
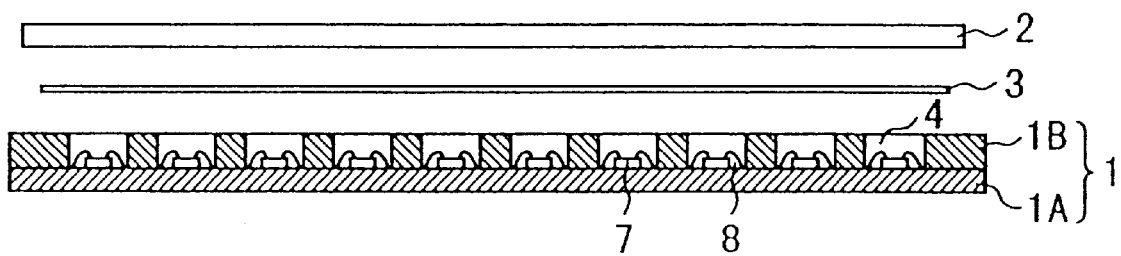
FIGS. 2A to 2C are cross-sectional views for describing the structure of a hollow package and a manufacturing method according to a first embodiment of the present invention.
Figure 2B:
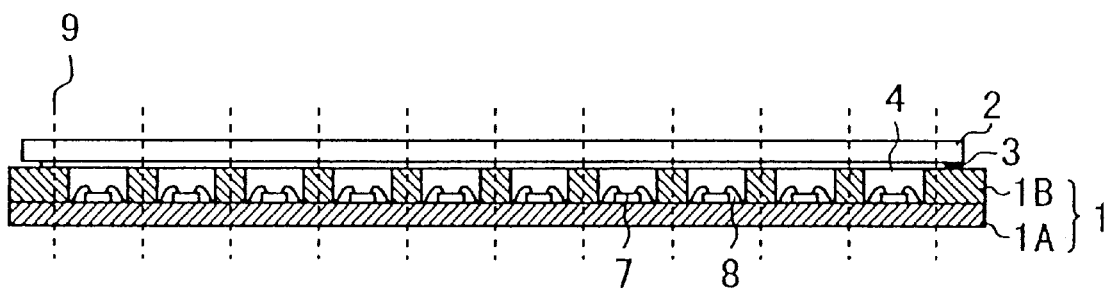
Figure 2C:
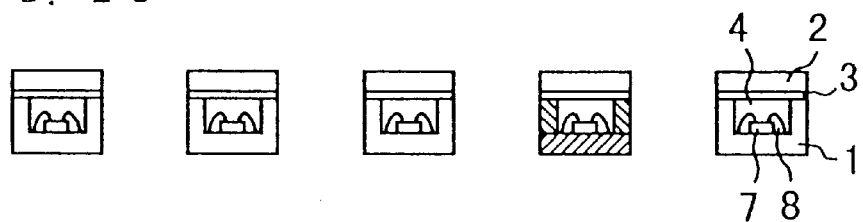
Figure 3A:
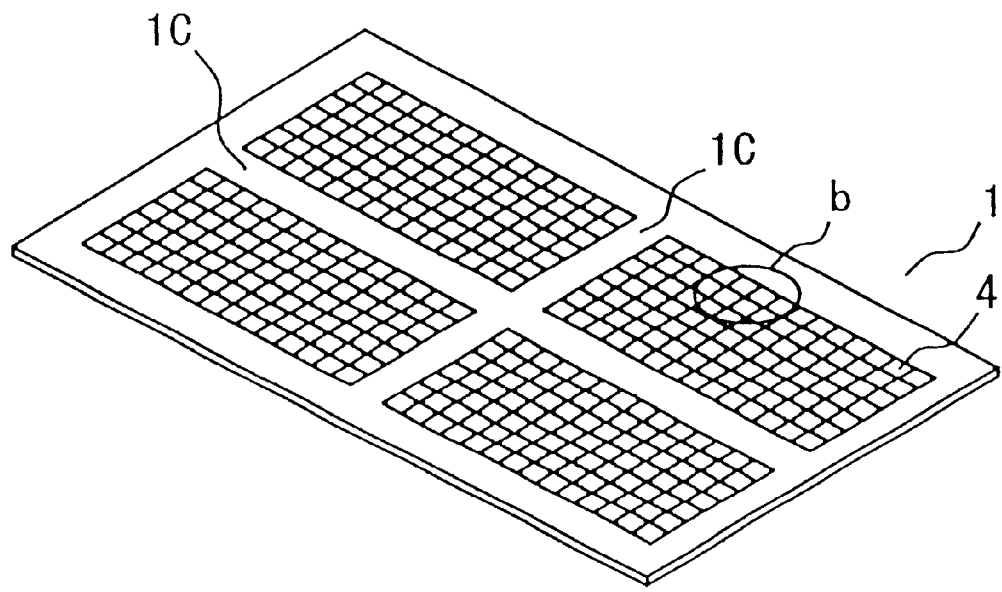
FIGS. 3A and 3B are a perspective view and an enlarged fragmentary plan view showing the structure of the base package substrate.
Figure 3B:
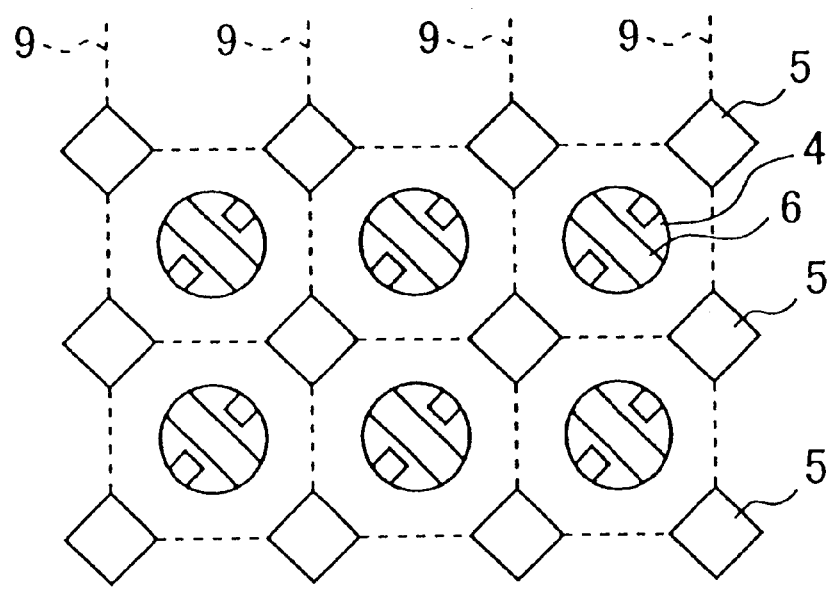
Figure 4:
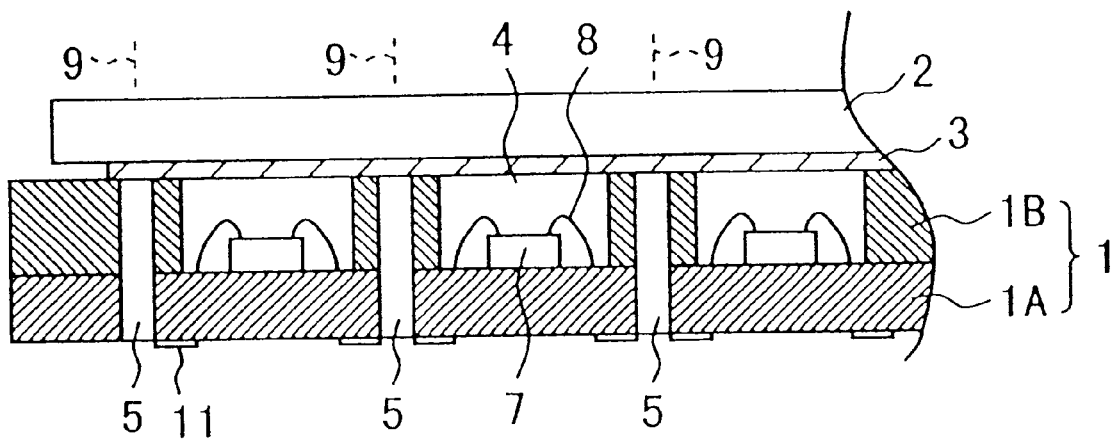
FIG. 4 is an enlarged cross-sectional fragmentary view of the sealed base package substrate.

FIGS. 1 through 4 are illustrations for describing a first embodiment of the present invention. FIG. 1 is a perspective view showing a base package substrate and cap members before they are bonded together; FIGS. 2A to 2C are cross-sectional views for describing the structure of a hollow package and a manufacturing method therefor; FIGS. 3A and 3B are illustrations for describing the structure of the base package substrate, wherein FIG. 3A is a perspective view and FIG. 3B is an enlarged fragmentary plan view; and FIG. 4 is a enlarged cross-sectional fragmentary view of the base package substrate after it is sealed.

As shown in FIGS. 1 through 2C, reference numeral 1 designates a base package substrate (hereinafter referred to simply as a "base substrate," as required) belonging to a hollow package; 2 designates a cap member; 3 designates a sheet-like adhesive; and 4 designates a cavity in a base substrate 1. As shown in FIGS. 2A to 2C, the cap members 2 are bonded to the front surface (primary surface) of the base substrate 1 by means of the adhesive 3.

As shown in FIGS. 2A and 2B, the base substrate 1 is formed by bonding together a lower first substrate 1A and an upper second substrate 1B. The first (lower) substrate 1A is of plate-like shape and comparatively large-sized, and a conductive pattern (not shown) is formed as an electrode on the surface (i.e., an upper surface in the drawing) thereof. The conductive pattern is connected to an exposed external electrode provided on the reverse side (i.e., a lower surface in the drawing) of the first substrate 1A.

Through holes or penetrating holes are formed in the second (upper) substrate 1B in order to produce hollow cavities. The first and second substrates 1A and 1B are stacked into the single base substrate 1, thereby constituting a substrate having a plurality of cavities 4.

In FIG. 2A, reference numeral 7 designates a semiconductor chip; and 8 designates a lead wire. The respective semiconductor chips 7 are mounted in the cavities 4 of the base substrate 1, and the electrodes of each of the semiconductor chip 7 are connected to the conductive pattern laid on the first substrate 1A by means of the lead wires 8.

FIG. 2B is a cross-sectional view showing the semiconductor chips 7 housed in the base substrate 1 after they are sealed by means of the cap member 2 and the adhesive 3. Reference numeral 9 designates a scribe line. FIG. 2C shows single semiconductor packages (i.e., semiconductor devices) separated from one another along the scribe line.

FIG. 4 is an enlarged fragmentary view of FIG. 2B. FIG. 4 shows an exposed external electrode 11 laid on the reverse side (i.e., a lower side in the drawing) of the base substrate 1. The external electrode 11 is electrically connected to the conductive pattern (not shown), which is provided as an electrode in each of the cavities 4. The external electrode 11 is used for establishing electrical connection when the separated semiconductor package is mounted.

As shown in FIG. 3A, the base substrate 1 is divided into four regions, thereby constituting a plurality of groups of cavities 4. In each of the regions, the cavities 4 are formed in a matrix pattern. Accordingly, the conductive pattern used for establishing electrical connection with the external terminal 11 is also uniformly provided in the four plane regions (areas).

As can be seen from the enlarge fragmentary plan view shown in FIG. 3B, a plurality of penetrating holes (or castrations) are formed in an amount of one per cavity 4 so as to penetrate through the base substrate 1. Reference numeral 6 designates the electrode formed on the surface of the semiconductor chip 7 mounted in the cavity 4.

The penetrating holes 5 are formed so as to penetrate through the base substrate 1 comprising the first substrate 1A and the second substrate 1B. The penetrating holes 5 are provided for three reasons; (1) for routing a metallized layer used for electrically connecting the conductive pattern laid on the front surface of the first substrate 1A to the exposed external terminal 11 laid on the reverse side of the first substrate 1A; (2) for enabling the end user to ascertain whether or not solder fillet has been formed at the time of a secondary mounting operation; and (3) for allowing the gas used during a sealing process to escape.

The base substrate 1, which comprises the first substrate 1A and the second substrate 1B, is formed from an alumina substrate of comparatively low purity (e.g., 90% pure) or an organic material.

With reference to FIGS. 2A and 2B, the sheet-like moisture-proof adhesive 3 may be applied beforehand to the surface of the cap member 2 which faces the base substrate 1. Alternatively, the moisture-proof adhesive 3 may be uniformly pasted to the overall surface of the cap member 2. The cap member 2 is formed from an ultra-thin alumina substrate of low purity or an organic material.

As shown in FIG. 1, the cap member 2 is large enough to cover one of the four cavity areas; that is, the cap member 2 is about one-quarter of the size of the base substrate 1.

The method of manufacturing the foregoing hollow package will now be described.

The base substrate 1 comprising the cavities 4 is formed by bonding the plate-like first substrate 1A to the second substrate 1B in which a plurality of through holes or penetrating holes are formed in a matrix pattern. The base substrate 1 is of a two-layer structure, and an electrode pattern is routed on only the first layer (i.e., the first substrate 1A). The second layer (i.e., the second substrate 1B) serves as a layer for constituting cavities.

As shown in FIG. 3A, packages are arranged by dividing the internal area of the base substrate 1 into four regions, each of which comprises a plurality of continuously-formed cavities. A region 1C in which no cavities are formed is formed in both the lengthwise center and the widthwise center of the base substrate 1 so as to assume the shape of a cross. The cross-shaped region 1C acts as a beam and imparts strength to the base substrate 1.

Further, the penetrating holes 5 are formed to penetrate to the reverse side of the base substrate 1 so as to be located at the corners of the respective cavities 4.

The semiconductor chips 7 are mounted in the respective cavities 4 formed on the base substrate 1, and each of the semiconductor chips 7 is electrically connected to the external terminal 11 by means of a lead wire 8 through die-bonding or wire-bonding. After completion of the die-bonding or wire-bonding process, the cap member 2 is placed on each of the four regions (areas) of the base substrate 1. At this time, the cap member 2 is one-quarter the size of the base substrate 1.

Subsequently, the moisture-proof adhesive (or a bonding material) 3 is set by application of heat and pressure.

The base substrate 1 having the cap members 2 bonded thereon is fixed to a dicing tape and is sliced along the scribe lines 9 by means of a dicer, thereby manufacturing semiconductor device packages, each containing the single semiconductor chip 7.

The foregoing description has explained the structure of the hollow package and the method of manufacturing a semiconductor package. There will now be described the characteristic and merits of the hollow package and those of the manufacturing method of the package according to the first embodiment.

(1) In the first embodiment, the semiconductor chips 7 are housed in the respective cavities 4 formed in the plate-like base substrate 1, and the cap members 2 are bonded onto the semiconductor substrate 1. The semiconductor substrate 1 is then diced. Consequently, the hollow package can achieve the same sealing and separation characteristics as those attained by transfer molding.

Further, the hollow package can yield the same productivity and cost as those yielded by a mold package while maintaining the advantage of hollow package structure in terms of high-frequency characteristics. Particularly, productivity relating to a sealing process can be significantly improved as compared with that yielded by the conventional mold package.

(2) As shown in FIGS. 1 to 2C, the plate-like cap members 2, each having an adhesive laid thereon, are placed on the base substrate 1 having the cavity structure, and the base substrate 1 is sliced through dicing or by means of a wire saw.

Although several methods of separating packages (PKG) are available, use of the dicing technique or the wire saw, as employed in the first embodiment, yields the following advantageous results.

(A) Stress exerted on the bonded surface when the packages are separated, along which the caps 2 and the packages are bonded, can be diminished, thereby preventing exfoliation of the bonded surface and ensuring air-tight integrity.

(B) The outer dimension of the thus-separated package have a high degree of precision.

(C) Use of laser scribing technique may involve a problem of inducing burns or stains along the scribed surface. In contrast, use of the dicing technique or the wire saw yields an advantage of no burns or stains.

(D) A plate-like cap member having a small thickness (less than 1 mm) is used as the cap member 2. Costs incurred by the cap members 2 can be diminished by forming the cap members 2 into the shape of a plate. Further, since the cap members 2 are already in plate form, placing the cap members 2 on the packages does not involve positioning, thereby diminishing costs relating to a manufacturing system.

(3) As shown in FIGS. 3A to 4, in the first embodiment, the penetrating holes 5 are formed in the base substrate 1 so as to penetrate to the reverse side, as well as to be located at the corners of the respective cavities 4.

When the cavities 4 expands in volume in the course of heat treatment performed during the sealing process, the air forcefully displaced from within the cavities 4 enters the space between the cap members 2 and the base substrate 1, thus creating voids. However, the penetrating holes 5 act as vent holes for releasing the gas accumulating in the resin, thus preventing the formation of voids and hence diminishing the likelihood of a leakage failure.

In a high-frequency semiconductor chip, a passivation film laid on the semiconductor chip is usually formed to be as thin as possible in order to maintain the characteristics of the semiconductor chip. If moisture is not prevented from entering the semiconductor package, the characteristics of the semiconductor package are deteriorated. For this reason, a leakage failure is not acceptable.

(4) Further, in the first embodiment, the base substrate 1 is formed into a two-layer structure. Electrode wiring is routed on only the first layer 1A of the substrate 1, and the second layer 1B constitute the cavities 4 and prevents formation of resin fillet at the time of sealing of the cap members 2.

In general, when resin of low viscosity is used as an adhesive for sealing purpose, resin flow arises when the resin is cured during the sealing process, with the result that the resin covers the external electrode provided on the inner surface of the penetrating holes 5, particularly the top portion of the electrode provided on the inner surface of the penetrating holes 5. In this case, solder does not adhere to the external electrode when the end user mounts the semiconductor package on a board, thereby resulting in a failure. Particularly, in the case of a base substrate having no second layer, resin flows to the electrode provided on the inner surface of the penetrating holes, thus causing a failure.

In the first embodiment, the base substrate has two layers, and hence the thickness of the two-layer structure prevents formation of resin fillet.

(5) Further, in the first embodiment, alumina material of low purity is used for the base substrate 1 and the cap members 2. Alternatively, the cap members 2 may be formed from thin material or organic material.

Alumina material of low purity has an excellent dicing characteristic, thereby realizing comparatively fast processing speed and extending the life of a blade of the dicer.

Thin ceramic or an organic substrate is used for the cap members 2. Although alumina contained in the base substrate warps or bends in a comparatively large degree, the cap members 2 can also sufficiently follow the warp or bent in the base substrate 1 if the thin cap members 2 are used for sealing, thus ensuring good sealing characteristics and making the cap members more easy to dice.

(6) In the first embodiment, the packages are arranged in the following method; namely, by uniformly dividing the internal area of the base substrate 1 into four areas, by forming a cross-shaped beam in the center of the base substrate, and by making the cap members to one-quarter the size of the base substrate (see FIGS. 1 through 3B).

As the base substrate becomes larger and thinner, the strength of the base substrate decreases. However, formation of the cross-shaped beam in the base substrate enables an increase in the strength of the base substrate.

Further, the warp in the overall base substrate can be diminished by pressing the cross-shaped beam during the wire-bonding process, thereby effecting stable bonding.

For these reasons, so long as the cap members are also formed so as to assume the same size as the four areas formed on the base substrate (i.e., one-quarter of the size of the base substrate), the warp in the base substrate stemming from a difference in thermal expansion during the sealing process can be reduced, and the residual stress in the center and ends of the cap areas can also be reduced.

(7) Further, in the first embodiment, an organic substrate, such as a glass-epoxy-based material, can be used for the base substrate instead of alumina material.

Although alumina material is selected as the material of the base substrate in consideration of deterioration in the high-frequency characteristics of the semiconductor package in the C-band or the Ku-band, the deterioration in the characteristics of the semiconductor package can become negligible if the package size is small. In such a case, so long as glass-epoxy material, which has an excellent package separation characteristic and is durable to warp, is used for the base substrate, productivity of the semiconductor package can be increased greatly.

Second Embodiment

Figure 5:
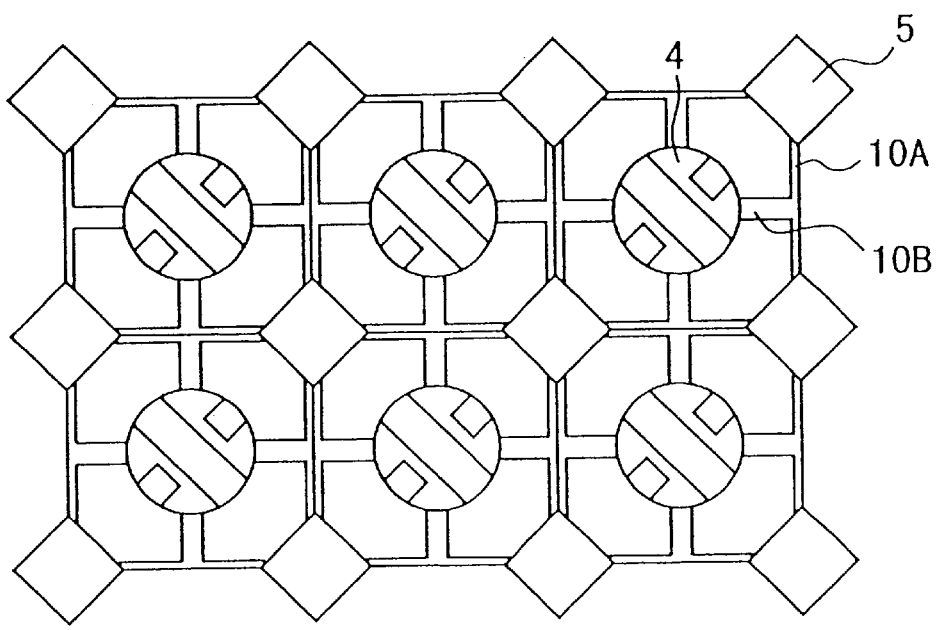
FIG. 5 is an enlarged fragmentary top view of a hollow package according to a second embodiment of the present invention.

FIG. 5 is an enlarged fragmentary top view for describing a hollow package according to a second embodiment of the present invention, showing the base substrate 1 before the base substrate 1 is sealed.

When the volume of each cavity 4 expands during the heat treatment performed in the sealing process, the inside air is forcefully displaced to enter the space between the cap members 2 and the base substrate 1, thus creating voids. As has been described in connection with the first embodiment, most of the voids escape from the penetrating holes 5 formed in the upper surface of the second substrate 1B (i.e., the upper substrate) of the base substrate 1. However, some of the voids remain in the scribe lines used for separating the semiconductor packages.

The voids do not cause leakage failures while the base substrate remains in the form of a sheet-like substrate. However, when the semiconductor packages are separated, the voids may cause leakage failures.

To prevent such leakage failures, trenches 10A are formed in the upper surface of the base substrate 1 so as to communicate with the adjacent penetrating holes 5. Further, trenches 10B are also formed in the base substrate 1 so as to connect the trenches 10A to the cavities 4. Formation of such trenches 10A and/or 10B results in active release of the voids remaining in the scribe line, thereby diminishing leakage failures in the semiconductor packages after dicing.

Third Embodiment

Figure 6:
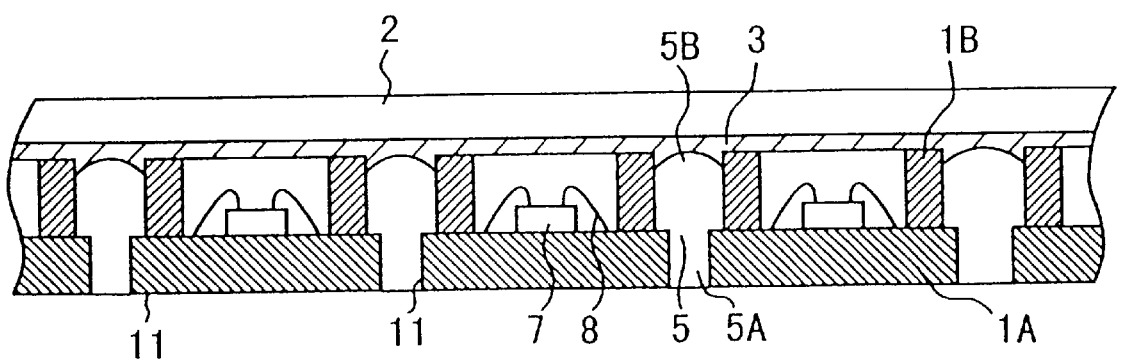
FIG. 6 is an enlarged fragmentary cross-sectional view of a hollow package according to a third embodiment of the present invention.

FIG. 6 is an enlarged fragmentary cross-sectional view for describing a hollow package according to a third embodiment of the present invention, showing the base substrate 1 after it has been sealed.

In the case where resin of low viscosity is used for the sealing adhesive material 3, if resin flow arises at the time of curing of the resin during the sealing process and if the penetrating holes 5 is formed in the base substrate 1 in a constant bore, the resin may cover the top portion of the external electrode 11 provided on the inner surface of the penetrating holes 5. In such a case, when the end user mounts a semiconductor package to a board, solder will not adhere to the external electrode, thereby causing a failure.

To prevent such a failure, as shown in FIG. 6, penetrating holes 5A formed in the first substrate 1A (i.e., the first lower substrate) are formed so as to become smaller in bore than penetrating holes 5B formed in the second substrate 1B (i.e., the second upper substrate). In short, a step in the penetrating holes 5 is formed between the first substrate 1A and the second substrate 1B, which prevents the resin from entering the penetrating holes 5A formed in the first substrate 1A. Even when resin of low viscosity is used as the sealing adhesive 3, the top portion of the external terminal 11 is not covered by the resin.

Fourth Embodiment

Figure 7:
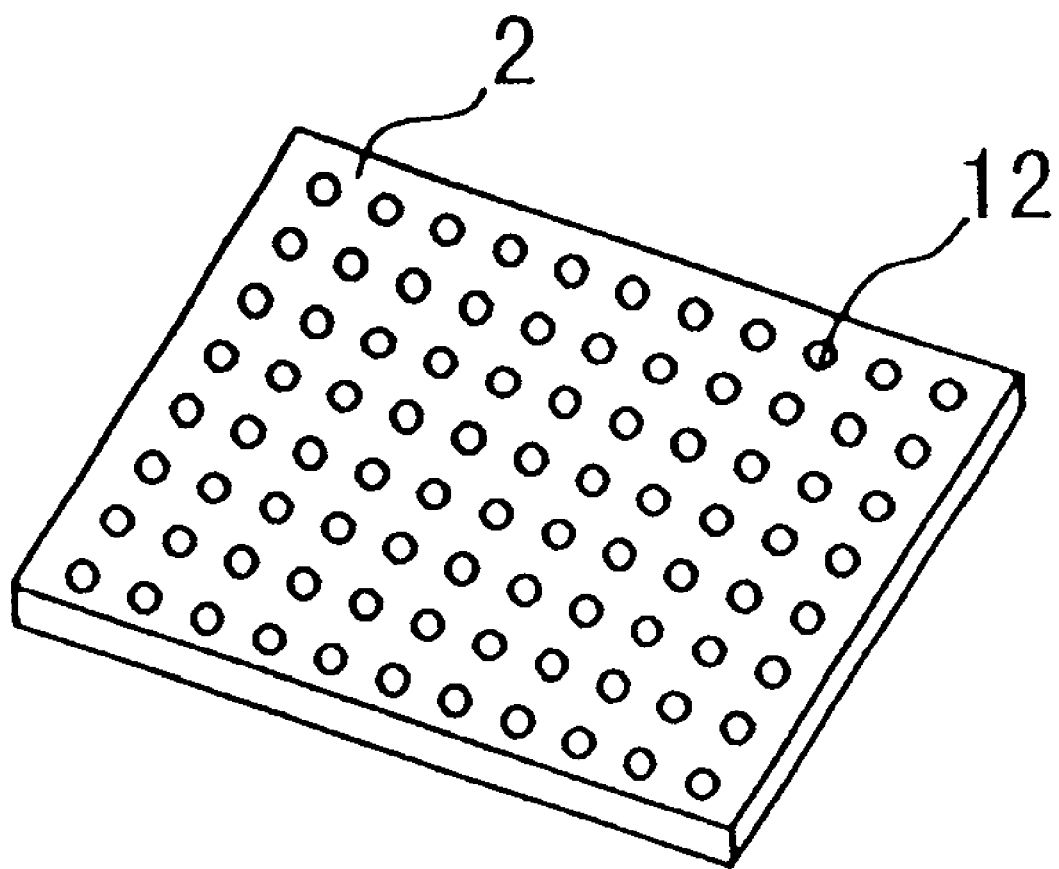
FIG. 7 is a perspective view of a cap member used for a hollow package according to a fourth embodiment of the present invention.

FIG. 7 is a perspective view for describing a hollow package according to the fourth embodiment, showing the state of the adhesive attached to a sealing surface of the cap member 2 before the cap member 2 is used for sealing.

The sealing adhesive 3 employed in the first embodiment assumes a sheet-like shape. When the cap members 2 are bonded to the base substrate 1 by increasing the amount of heat applied during the sealing process, voids developing in the sealing adhesive 3 remain in the sheet surface thereof. To prevent formation of the voids, the pattern of the adhesive is changed from sheet form to a dot pattern. Reference numeral 12 designates dot-patterned adhesive attached to the surface of the cap member 2, which is to be bonded to the base substrate 1.

When the base substrate 1 is sealed, voids developing in the adhesives 12 are pressed and discharged to the outside by way of the space between the dots. After the base substrate 1 has been fully sealed by the cap member 2, no voids remain in the resin. Accordingly, even after separation of the base substrate 1 into packages, no leakage failure arises in the semiconductor packages.

In this embodiment, each dot-patterned adhesive 12 may correspond to cover each cavity area 4 housing a semiconductor chip 7.

Fifth Embodiment

In the first embodiment, the semiconductor chips 7 are mounted on the base substrate 1 through wire bonding.

A fifth embodiment is the same as the first embodiment in terms of the package structure and the manufacturing method. However, the fifth embodiment employs flip chip bonding instead of wire bonding, so that a chip is bonded directly to the base substrate 1, thus yielding an advantage of further miniaturization of the semiconductor package, as well as an improvement in the high-frequency characteristic of the semiconductor package.

The effects and advantages of the present invention may be summarized as follows.

According to the present invention, semiconductor chips are housed in respective cavities formed in a plate-like base substrate. Plate-like cap members are bonded onto the base substrate, and the base substrate is diced into semiconductor packages. As a result, sealing and separation characteristics which are the same as those achieved by transfer molding can be attained.

Further, there can be provided a semiconductor device of hollow package structure which ensures the same productivity and costs as those yielded by a mold package and does not cause a deterioration in high-frequency characteristics.

Further, in the present invention, penetrating holes are formed in the vicinity of the respective cavities formed in the base substrate so as to penetrate to the reverse side thereof. The penetrating holes act as vent holes for voids accumulating in resin, thereby preventing occurrence of voids and reducing the likelihood of a leakage failure.

Further, the base substrate has a two-layer structure. An electrode wiring is routed only on the first layer, and the second layer constitutes the cavities and prevents formation of resin fillet, which would otherwise be caused during sealing of the base substrate by the cap members. Therefore, the thickness of the second layer prevents resin flow.

Further, a step is formed in the penetrating holes, thus preventing resin flow.

Under the method of arranging packages in the base substrate according to the present invention, the internal area of the base substrate is divided into a plurality of regions, and a beam is formed among the thus-divided regions, thereby increasing the strength of the base substrate.

The cap members are made smaller so as to become equal in size to the respective regions formed on the base substrate, thereby preventing a warpage, which would otherwise occur during the sealing process due to a difference in thermal expansion. Further, residual stress in the center and ends of the cap members can also be reduced.

Trenches are formed in the upper surface of the base substrate so as to connect adjacent penetrating holes together, or further trenches are formed so as to connect the adjacent trenches and the cavities of the base substrate, thereby releasing voids and reducing the likelihood of a leakage failure, which would otherwise occur in the semiconductor packages after dicing.

The cap members maybe bonded by means of dot-patterned adhesives, thus reducing the likelihood of a leakage failure, which would otherwise be caused during the sealing process.

According to the present invention, alumina material of low purity is used for either or both of the base substrate and the cap members. The alumina material is easy to dice, enables use of a comparative faster processing speed, and extends the life of a blade of a dicer.

Thin ceramic or an organic substrate may be used for the cap members, thus ensuring a good sealing characteristic.

According to the present invention, an organic-based substrate, such as glass-epoxy-based material, may be used as the base substrate, as required. The organic substrate enables easy separation of semiconductor packages, causes less warpage, and can improve productivity.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-87583, filed on Mar. 30, 1999 including specification, claims, drawings and summary, on which the Convention priority of the present application is based, are incorporated herein by reference in its entirety.

What is claimed is:

1. A semiconductor device comprising:

a first plate-like base substrate having a primary surface and a rear surface opposite to said primary surface, said first plate-like base substrate having a substantially rectangular extrapolated outer shape in a plane parallel to said primary surface, said first plate-like base substrate having a base electrode on said rear surface;

a second base substrate connected to said primary surface of said first plate-like base substrate, said second base substrate having a substantially same extrapolated outer shape in a plane parallel to said primary surface of said first plate-like base substrate; said second base substrate having a penetrating hole perpendicular to said primary surface of said first plate-like base substitute;

a plate-like cap member connected to said second base substrate to cover said penetrating hole in said second base substrate; and a semiconductor chip housed in a cavity surrounded by said first plate-like base substrate, said second base substrate and said plate-like cap member, said semiconductor chip being electrically connected to said base electrode;

wherein said first plate-like base substrate and said second base substrate each includes at least one truncated corner.

2. The semiconductor device according to claim 1, wherein said first plate-like base substrate is formed from an alumina substrate of comparatively low purity or an organic material.

3. The semiconductor device according to claim 1, wherein said second plate-like base substrate is formed from an alumina substrate of comparatively low purity or an organic material.

4. The semiconductor device according to claim 1, wherein said cap member is formed from an alumina substrate of comparatively low purity or an organic material.

5. A semiconductor device comprising:

a first plate-like base substrate having a primary surface and a rear surface opposite to said primary surface, said first plate-like base substrate having a substantially rectangular extrapolated outer shape in a plane parallel to said primary surface, said first plate-like base substrate having a base electrode on said rear surface;

a second base substrate connected to said primary surface of said first plate-like base substrate, said second base substrate having a substantially same extrapolated outer shape in a plane parallel to said primary surface of said first plate-like base substrate; said second base substrate having a penetrating hole perpendicular to said primary surface of said first plate-like base substrate;

a plate-like cap member connected to said second base substrate to cover said penetrating hole in said second base substrate; and a semiconductor chip housed in a cavity surrounded by said first plate-like base substrate, said second base substrate and said plate-like cap member, said semiconductor chip being electrically connected to said base electrode;

wherein said first plate-like substrate and said second base substrate each includes at least one truncated corner and wherein the at least one truncated corner of said second base substrate is more truncated than a corresponding truncated corner of said first plate-like substrate.

6. A semiconductor device comprising:

a first plate-like base substrate having a primary surface and a rear surface opposite to said primary surface, said first plate-like base substrate having a substantially rectangular extrapolated outer shape in a plane parallel to said primary surface, said first plate-like base substrate having a base electrode on said rear surface;

a second base substrate connected to said primary surface of said first plate-like base substrate, said second base substrate having a substantially same extrapolated outer shape in a plane parallel to said primary surface of said first plate-like base substrate; said second base substrate having a penetrating hole perpendicular to said primary surface of said first plate-like base substrate;

a plate-like cap member connected to said second base substrate to cover said penetrating hole in said second base substrate; and a semiconductor chip housed in a cavity surrounded by said first plate-like base substrate, said second base substrate and said plate-like cap member, said semiconductor chip being electrically connected to said base electrode;

wherein said first plate-like substrate and said second base substrate each includes at least one truncated corner and wherein at least a trench is formed on the surface of said second base substrate at the adjoining plane with said cap member, said trench is running to the cavity from outside of said second base substrate.

* * * * *

UNITED STATES PATENT AND TRADEMARK OFFICE
CERTIFICATE OF CORRECTION

PATENT NO. : 6,621,161 B2
DATED : September 16, 2003
INVENTOR(S) : Katumi Miyawaki It is certified that error appears in the above-identified patent and that said Letters Patent is hereby corrected as shown below:

<u>Title page,</u>
Please add Item -- [30]  Foreign Application Priority Data
March 30, 1999 (JP)……………………………..11-87583 --

Signed and Sealed this

Twentieth Day of January, 2004

JON W. DUDAS
*Acting Director of the United States Patent and Trademark Office*